Figure 1:
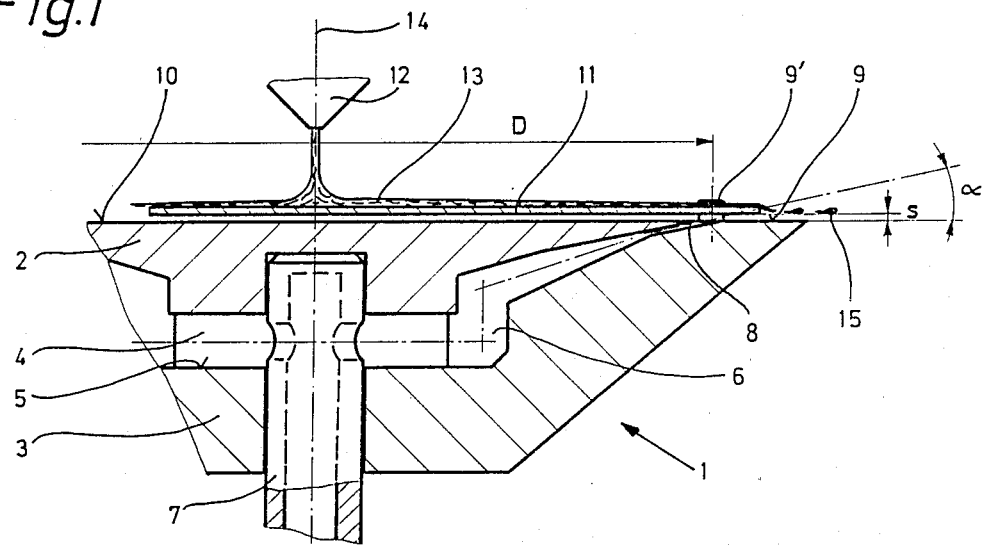

United States Patent [19]

Sumnitsch

[11] Patent Number: 4,903,717
[45] Date of Patent: Feb. 27, 1990

[54] SUPPORT FOR SLICE-SHAPED ARTICLES AND DEVICE FOR ETCHING SILICON WAFERS WITH SUCH A SUPPORT

[75] Inventor: Franz Sumnitsch, Klagenfurt, Austria

[73] Assignee: Sez Semiconductor-Equipment Zubehoer Fuer die Halbleiterfertigung Gesellschaft m.b.H, Kaernten, Austria

[21] Appl. No.: 269,017

[22] Filed: Nov. 9, 1988

[30] Foreign Application Priority Data

Nov. 9, 1987 [AT] Austria .................................. 2958/87

[51] Int. Cl.⁴ ............................................... B08B 3/02
[52] U.S. Cl. ......................................... 134/99; 118/52; 118/54; 134/153; 134/155; 134/157; 156/345; 269/21; 294/64.3
[58] Field of Search ................. 134/99, 103, 149, 153, 134/154, 155, 157, 161; 118/52, 54, 320; 156/345; 269/20, 21; 294/64.3

[56] References Cited

U.S. PATENT DOCUMENTS 3,953,265  4/1976  Hood .............................. 156/345 X
4,118,058 10/1978  Rahn et al. .......................... 294/64.3
4,350,562  9/1982  Bonu ............................... 156/345 X
4,445,494  5/1984  Schiele et al. ...................... 269/20 X

FOREIGN PATENT DOCUMENTS 0140755  5/1985  European Pat. Off. ............ 156/345
0113265  9/1979  Japan ................................. 118/320
0092620  5/1985  Japan ................................. 156/345
0086822  4/1987  Japan ................................. 118/52

OTHER PUBLICATIONS

IBM Technical Disclosure Bulletin, vol. 22, No. 5, Oct. 1979.

Primary Examiner—Philip R. Coe
Attorney, Agent, or Firm—Young & Thompson

[57] ABSTRACT

A device is disclosed for etching silicon wafers, with a support (1) for the silicon wafers, an annular nozzle (8) being provided in the surface (9, 10) of this support that faces the silicon wafer (11), the nozzle being chargeable with compressed gas for the formation of a gas cushion between the support (1) and the silicon wafer (11), the gas exiting between the wafer (11) and the support (1) preventing passage of treatment fluid onto the underside of the wafer (11). The support (1) is located within the interior (21) of an annular tank (20) wherein at least two annular ducts (25, 26, 27) are provided which are open toward the interior (21) of this tank. Furthermore, means are included for lifting and for lowering the support (1) with respect to the tank (20) and for setting the support (1) into rotation about its axis (14) which latter is congruent with the central axis of the tank (20).

9 Claims, 4 Drawing Sheets

SUPPORT FOR SLICE-SHAPED ARTICLES AND DEVICE FOR ETCHING SILICON WAFERS WITH SUCH A SUPPORT

The invention relates to a support for slice-shaped articles, especially for silicon wafers during the etching thereof, with at least one nozzle in the preferably circular surface of the support facing the article, this nozzle being chargeable with compressed gas for the formation of a gas cushion between the support and the slice-shaped article, the outlet orifice of this nozzle forming an acute angle with the surface of the support that faces the article, and with stops arranged on the surface of the support facing the article for the lateral supporting of the slice-shaped article.

In the treatment of disk-shaped articles, e.g. for the unilateral etching of silicon slices (wafers) with various acids, it has been necessary heretofore to protect the side of the wafer not to be treated, i.e. the face of silicon wafers that is not to be etched, by special measures from the attack by the etching fluids.

A device for holding wafers has been known from IBM TECHNICAL DISCLOSURE BULLETIN 11, No. 2, July 1968, which operates according to the Bernoulli principle wherein a gas is supplied via a central duct and the thus-fed gas is again withdrawn by way of an annular nozzle arranged within the rim of the wafer. A outlet for the gas between the body of the holder and the wafer is thus lacking.

Figure 2:
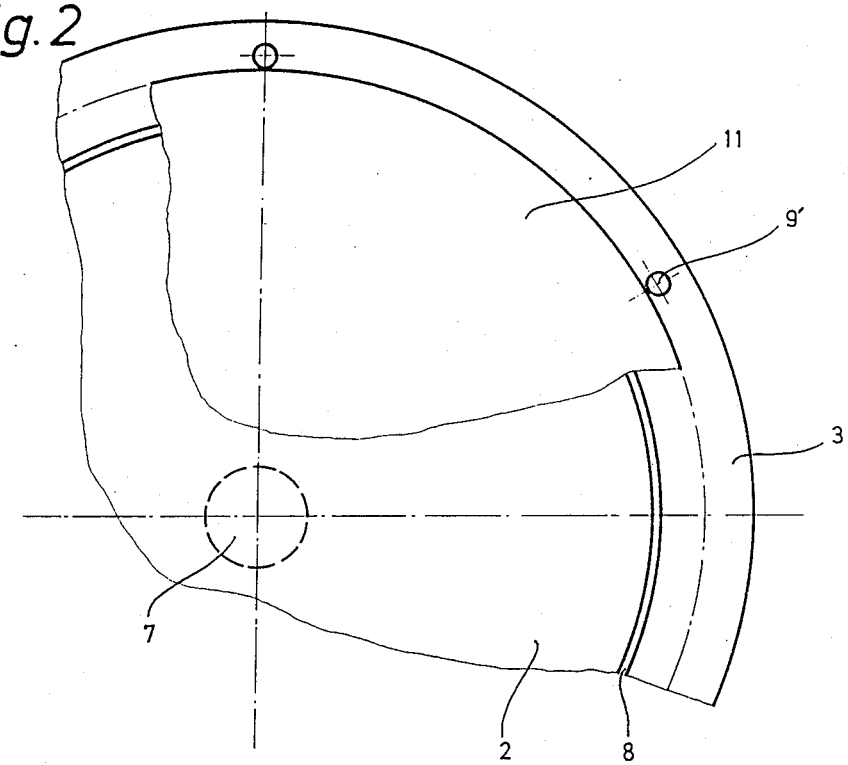

This likewise holds true for the device illustrated in IBM TECHNICAL DISCLOSURE BULLETIN 20. No. 2, July 1977, reference being had, in particular, to FIG. 2 shown therein.

U.S. Pat. No. A-3,523,706 and IBM TECHNICAL DISCLOSURE BULLETIN 18, No. 6, November 1975, which latter contains essentially the same disclosure in the present context, each describes a device for holding wafers, operating in accordance with the Bernoulli principle; as can be seen from FIG. 1a of U.S. Pat. No. A-3,523,706, several nozzles are provided oriented obliquely to the surface of the holding means facing the wafer to be held.

The conventional devices are consequently unsuitable for reducing penetration of treatment fluid to the underside of the wafers.

The invention is based on the object of providing a support of the type discussed hereinabove, by means of which slice-shaped articles, especially silicon wafers, can be treated without having to protect the other side of the slice-shaped articles, which is not to be treated, by means of special measures from attack by the treatment fluid.

According to the invention, this object has been attained by providing that the nozzle is an annular nozzle and that the support consists of two rotationally symmetrical, equiaxial parts, and that an annular space is arranged between the two parts, this space terminating toward the annular nozzle.

The support according to this invention ensures, on the one hand, that the disk-shaped article to be treated is securely held against the support without being in flat contact with the support proper. Furthermore, the gas supplied to the support and exiting from the nozzle, which gas forms the gas cushion on which the article is disposed, has the effect that fluid flowing away from the rim of the article to be treated cannot pass onto the underside of the disk-shaped article, not to be treated, but rather is blown away from the rim of the disk-shaped article. When using the support according to this invention, it is likewise ensured that the treatment fluid is not sucked, by capillary effect, in between the surface of the support facing the slice-shaped article and the slice-shaped article proper.

Since, especially when treating silicon wafers, these slices are normally of a circular shape, the annular nozzle provided according to this invention is especially advantageous.

It is advantageous within the scope of this invention, no matter whether several annularly arranged single nozzles or a continuous annular nozzle are or is provided, for the outlet orifice of the nozzle to form an acute angle $\alpha$ with the surface of the support that faces the article. On account of this feature, utilizing the aerodynamic paradox, it is ensured that the spacing of the disk-shaped article from the surface of the support facing this article is maintained constant extensively independently of the pressure of the gas flowing out of the nozzle, and blowing away of the article from the support is prevented.

It is expedient within the scope of this invention for the support to be located at the end of a shaft having a quill design, the interior of this shaft being in communication with the space between the two parts of the support for supplying compressed gas thereto. In this way, feeding compressed gas to the nozzle becomes particularly simple.

The provision can furthermore be made within the scope of this invention that the external component part of the support has an annular surface constituting the radially outward region of the surface of the support facing the article, this part being preferably made of a synthetic resin. In this case, it is furthermore advantageous for the inner part to exhibit a circular surface constituting the radially inward region of the surface of the support facing the article, this part being preferably manufactured of metal. In this way, the annular nozzle of the support, which is of a very narrow design, can be produced in an especially simple way.

By providing upwardly projecting cams, as abutments for the article, along the rim of the surface of the support facing the article, which cams are uniformly distributed along this rim, in accordance with a feature of this invention, then the lateral support does not impede the efflux of the compressed gas from the nozzle and between the rim of the disk-shaped article and the surface of the support facing this article.

When cams are arranged, it is preferred to design same so that they are radially adjustable in order to be able to clamp the wafer to be treated in place between the cams, if necessary. For this purpose, the cams can be fashioned as eccentrics, associated for the sake of simplicity with a drive mechanism common to all of the eccentrics, for purposes of rotating (e.g. gear ring/pinion).

The invention furthermore has as its object to indicate a device for etching silicon slices making it possible to perform the etching of silicon wafers in an especially simple way, the treatment fluids (rinse water and acid) being collected and, insofar as possible, being passed on to reuse.

In attaining this object, the device comprising a support according to this invention is characterized in that the support is arranged in the interior of an annular tank, there being arranged within the tank at least two annular ducts open to the inner space of this tank; and that means are provided for changing the relative positioning between support and tank.

When using the device of this invention for the etching of silicon wafers, the support can be aligned during each treatment step with respect to the corresponding annular duct in its level in the tank, so that liquid coming from the support will enter the annular duct.

In a particularly simple embodiment, the provision is made that the support is designed, by means of the shaft carrying the latter, so that it can be lifted and lowered with respect to the tank.

The rotary movement of the support, advantageous for the operation of the device according to this invention is attained especially if a motor is associated with the shaft of the support, in order to set the support in rotation about its axis which is congruent with the central axis of the tank.

Feeding of the compressed gas is especially simple if, as provided within the purview of this invention, the shaft for the support is fashioned to be hollow and is connected to a source of compressed gas.

In a practical embodiment of the device of this invention, the device is distinguished in that the annular ducts arranged in the tank are open toward the inner space of the tank by way of apertures that are slot-shaped and are located at a higher level than the bottoms of the ducts. In this embodiment, there is no danger of vapors from the treatment fluid or spray mists exiting the device in an uncontrolled fashion.

The device of this invention can furthermore be distinguished in that an annular space is provided in the tank outside of the radially outward walls of the ducts, this space being connected to a suction removal means; and that each of the ducts is in communication with the annular space by way of at least one aperture arranged in the upper zone of its outer wall.

In order to feed the treatment fluids to the support located in the interior of the tank of the device according to this invention, it is recommended that the device is designed so that a conduit for returning the liquid collected in the duct is connected to each duct, for reusing and/or for discharging such liquid.

Furthermore, the provision can be made that at least one conduit terminates above the support located in the interior of the tank; a treatment fluid can be supplied to the support by way of this conduit. In this connection, it is recommended that a conduit for feeding rinse water, preferably deionized or distilled water, and at least one, preferably two conduits for supplying at least one acid be included.

Figure 3:
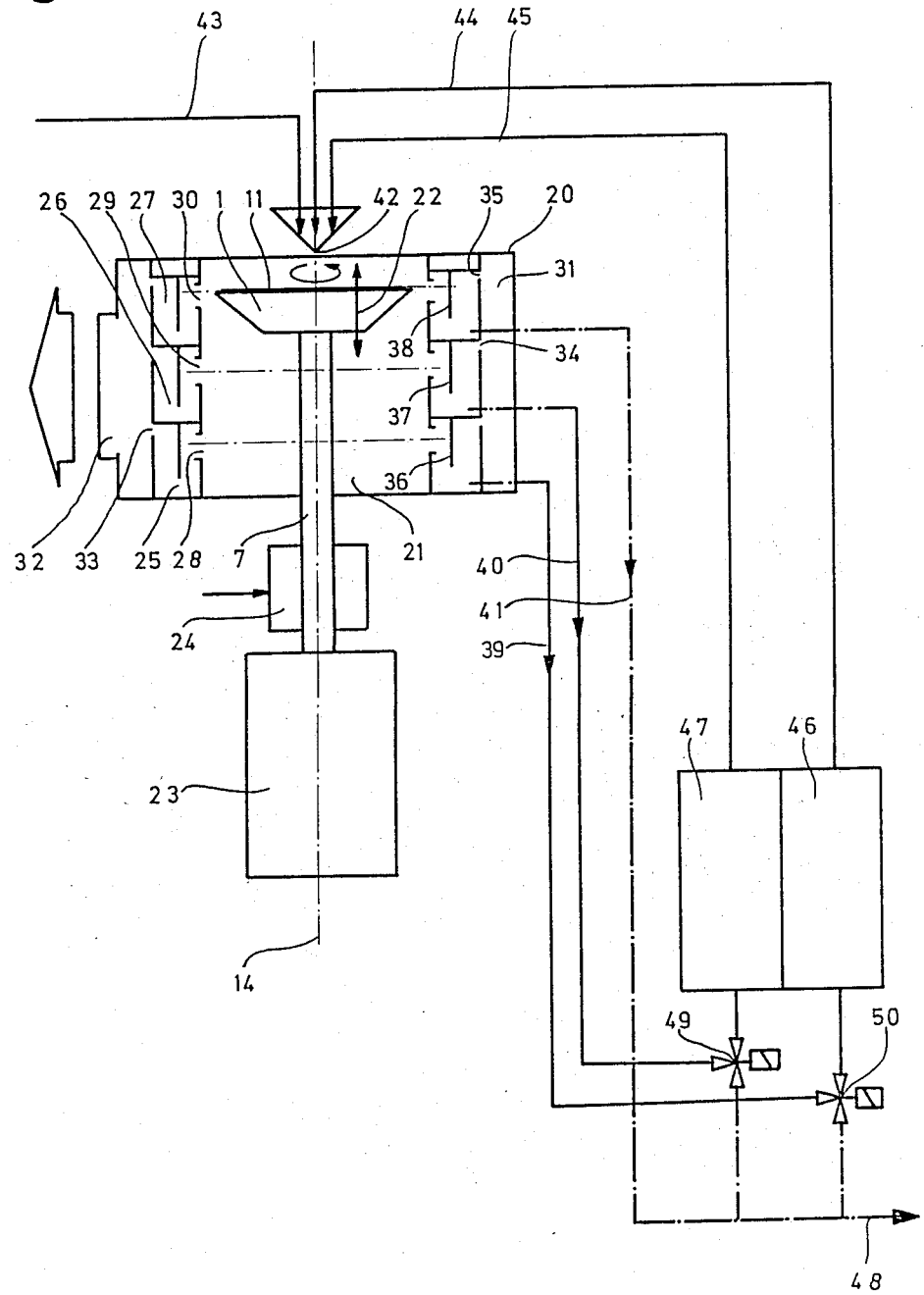
Figure 4:
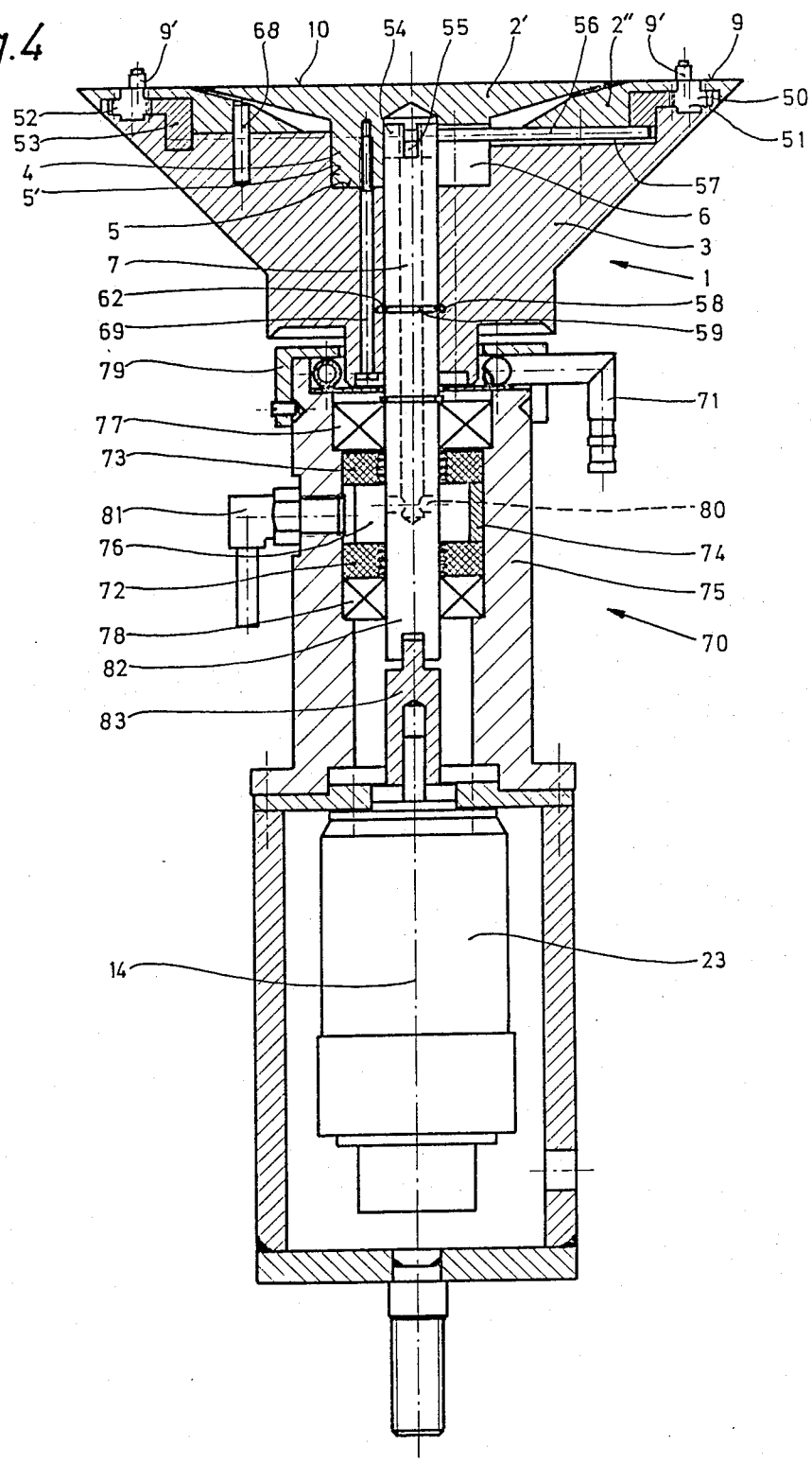
Figure 5:
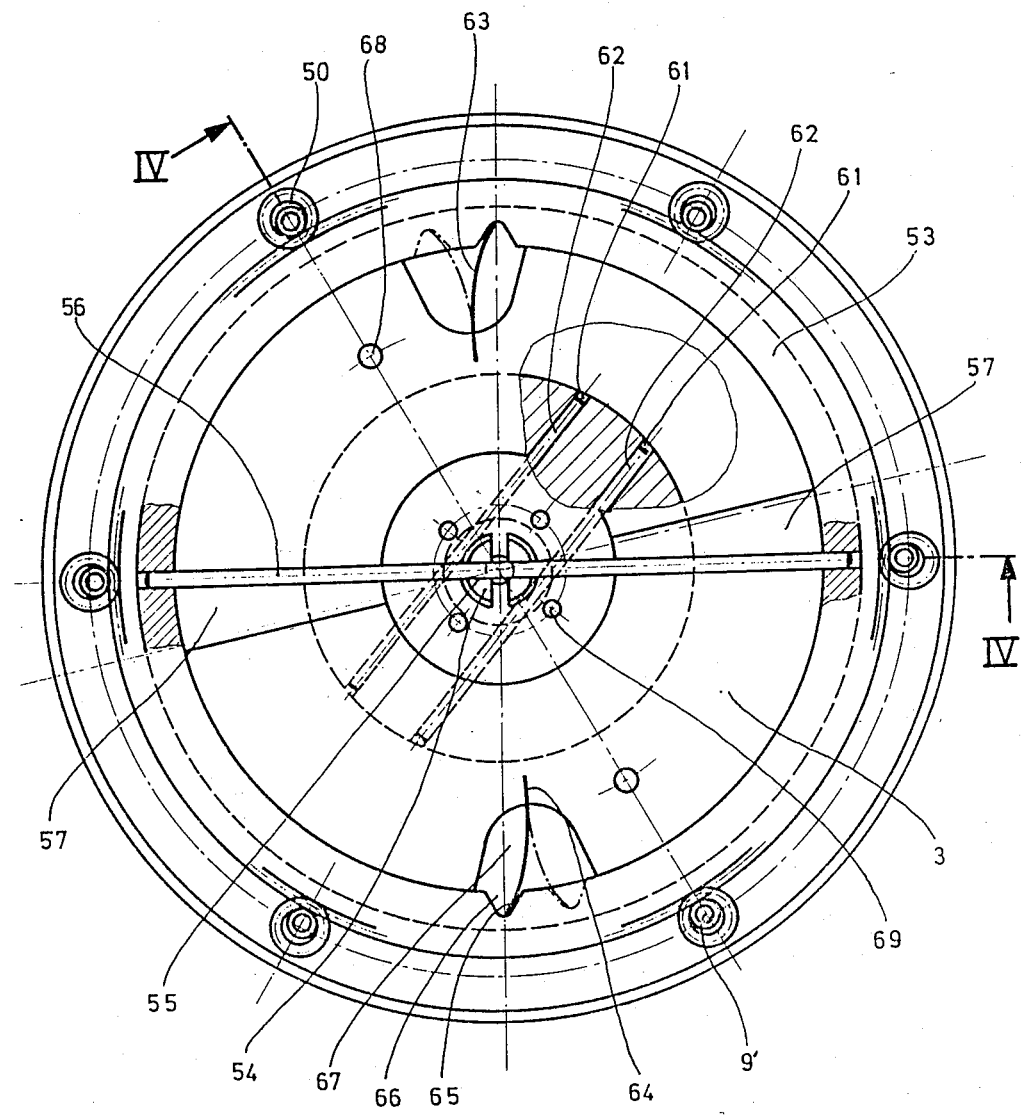

Additional details and features of the invention can be seen from the following description of the embodiments illustrated schematically in the drawings wherein:

FIG. 1 is a fragmentary sectional view of a support,
FIG. 2 is a top view thereof,
FIG. 3 shows schematically a device for etching silicon wafers, with a support in accordance with FIGS. 1 and 2,
FIG. 4 is a section through another embodiment of a support with storage unit and drive motor along line IV—IV in FIG. 5, and
FIG. 5 is a top view of the supports in FIG. 4, wherein parts of the support are not shown for a clearer illustration.

A support 1 illustrated in FIG. 1 is designed to be rotationally symmetrical and consists of an inner part 2, preferably manufactured from a metal, and an outer part 3 which is approximately tank-shaped and preferably consists of a synthetic resin. The inner part 2 is seated with an extension 4 on an upwardly oriented surface 5 of the outer part 3, so that the relative position of the parts 2 and 3 with respect to each other is defined.

A space 6 is provided between the two parts 2 and 3 of the support 1; by way of a shaft 7 of hollow design, gas under pressure, such as, for example, air or nitrogen, can be introduced into this space. The space 6 terminates in an annular nozzle 8, the boundary walls of this nozzle, formed by parts 2 and 3, defining an acute angle with the upper surface of the support 1.

The upper end face of the support 1 is constituted by a circular-ring surface 9 of part 3 and a circular surface 10 of part 2. Between the circular-ring surface 9 and the circular surface 10, the annular nozzle 8 terminates at the topside of support 1.

Cams 9' project upwardly from the circular-ring surface 9; these cams serve for the lateral supporting of a circular, disk-shaped article 11 arranged on support 1. The disk-shaped article 11 is held at a distance S from the surface of support 1 (annular surface 9 and circular surface 10) facing the article by means of the gas fed via the quill shaft 7 and discharged from nozzle 8. Due to the special structure of annular nozzle 8, a vaccum results during efflux of the gas in the zone D of the face 9, 10 of support 1 facing the article 11; by means of this vacuum, the slice-shaped article 11 is held down and is not blown away by the gas flowing out of the annular nozzle 8. In this arrangement, the advantage is obtained that the spacing S is extensively independent of the pressure of the gas introduced into space 6 and flowing out of the ring nozzle 8.

FIG. 1 illustrates furthermore that a conduit 12 terminates above the disk-shaped article; through this conduit, a treatment fluid 13, e.g. an acid for etching a silicon wafer, can be supplied to the top surface of the slice-shaped article 11. FIG. 1 also shows that the treatment fluid applied to the disk-shaped article 11 forms a liquid film on the topside of the article, the thickness and uniformity of this film over the entire surface depending on the quantity of treatment fluid applied and on the speed of revolution of the support 1 about its axis 14. The film of treatment fluid ruptures on the outer edge of the disk-shaped article 11, and the droplets 15 are additionally blown away by the gas ejected from the annular nozzle 8, as indicated in FIG. 1, so that the bottom side of the disk-shaped article 11 is not wetted by treatment fluid.

The device shown in FIG. 3 for etching silicon wafers—this device can be utilized analogously also for the treatment of other slice-shaped articles with various treatment liquids—consists of a tank 20, the support 1 being accommodated in the interior 21 of this tank to be liftable and lowerable in the direction of double arrow 22. For this purpose, the motor 23 driving the shaft 7 can be moved upwards and downwards by a drive mechanism that is not shown in detail.

A collar 24 is associated with the shaft 7, by way of which a compressed gas, such as compressed air or nitrogen can be introduced into the hollow space provided in the shaft. To this end, the collar 24 is connected to a source of compressed gas.

In the tank 20, three ducts 25, 26 and 27 are arranged in superposition. The annular ducts 25, 26 and 27 are open, via annular slots 28, 29 and 30, toward the interior 21 of the trough 20.

Outside of the ducts 25, 26 and 27, an annular space 31 is provided in the trough 20 and is in communication via a connecting member 32 with an exhaust means. The ducts 25, 26 and 27 are connected to the annular space 31 by way of apertures 33, 34 and 35.

In each duct 25, 26 and 27, restrictors 36, 37 and 38 are additionally provided which terminate at a distance above the bottom of each duct 25, 26 and 27. These restrictors 36, 37 and 38 prevent fluid flung away by the disk-shaped article, e.g. the silicon wafer, arranged on the support 1 from passing directly to the outlet orifices 33, 34 and 35 of the ducts 25, 26 and 27.

Conduits 39, 40 and 41 lead away from the ducts 25, 26 and 27.

Above the support 1, conduits 43, 44 and 45 terminate, preferably in a joint aperture 42. The orifice or orifices of conduits 43, 44 and 45 can be jointly adjusted with respect to height, together with the support 1, as compared with the trough 20, in order to maintain the relative distance between the support 1 and the orifice 42 at a constant value. Rinse water, e.g. deionized water, can be fed via conduit 43. The conduits 44 and 45 emanate from containers 46 and 47 wherein the treatment fluids, for example acids, are held in storage.

The conduit 41 from duct 27 is connected to a discharge conduit 48. The conduit 40 leads to a three-way valve 49, and the conduit 39 leads to a three-way valve 50. By an appropriate setting of valves 49 and 50, respectively, liquid withdrawn from ducts 25 and/or 26 (acid) can either be recycled into the storage containers 46 and 47, respectively, or passed on to the discharge conduit 48.

The fine acid droplets and, respectively, liquid droplets flung away by the silicon wafer arranged on the support 1 condense in the ducts 25, 26 and 27, and the liquids are then withdrawn via the conduits 39, 40 and 41.

Pumps, not shown in detail, can be utilized for transporting the liquids.

The exhaust means, consisting of the annular space 31 and the connecting member 32 leading to a suction pump, ensures a definite air flow during operation of the device.

After rinsing the disk-shaped article 11 (silicon wafer), during which process the support 1 is aligned with respect to the duct 27, as illustrated in FIG. 3, the number of revolutions of the support 1 is increased so that the wafer 11 is dried by being centrifuged at a high number of revolutions, before it is released for unloading.

In the embodiment illustrated in FIGS. 4 and 5, part 2 is replaced by a turntable top section 2″ and a lid 2′. The lid 2′ forms the circular area 10, and the turntable top section 2″ constitutes the annular surface 9. The ring nozzle 8 is formed by the boundary walls of the turntable top section 2″ and of the lid 2′. A toothed rim 53 and the shafts 50 carrying the cams 9′ and pinions 52 are supported between the turntable top section 2″ and part 3. The pinions 52 of the shafts 50 and the toothed rim 53 are in meshing engagement. The cams 9′ are arranged eccentrically on the shafts 50 so that the radial distance of the cams 9′ from the central axis 14 changes upon rotation of the shafts 50 by the toothed rim 53.

The turntable top section 2″ is attached to part 3 by means of two fitting pins 68 and a snap closure which latter is not illustrated in detail.

The lid 2′ is supported by the extension 4 via an upwardly oriented surface 5 and a cylindrical surface 5′ of part 3, so that the relative position of lid 2′ and of the outer part 3 with respect to each other is defined. The lid 2′ and the outer part 3 are fixedly connected in the axial direction by means of four screws 69. By the insertion of shims between the extension 4 of the lid 2′ and the surface 5 of the outer part 3, the relative position of lid 2′ to the outer part 3 can be varied in the axial direction whereby the width of the annular slot 8 between the lid 2′ and the turntable top section 2″ is variable.

The rotation of the cams 9′ on the shafts 50 takes place via the toothed rim 53. The toothed rim 53 is driven via a rod 56 by the quill shaft 7. The rod 56 is supported with its to ends in bores provided in the toothed rim 53 and in a slot 55 provided in the end 54 of shaft 7. The slot 55, open toward the end 54 of shaft 7, and lying in an axial plane of shaft 7, permits mounting of the shaft 7 by pushing it on the rod 56, without any problems. Furthermore, this arrangement also ensures that the lid 2′ is displaceable in the axial direction with respect to the outer part 3 for changing the width of the annular gap 8.

In order to provide for rotation of the toothed rim 53 by the rod 56, cutouts 57 having the shape of a circular ring are provided on the topside of the outer part 3, the rod 56 being able to move in these cutouts when rotated about the central axis 14. These cutouts 57 can be seen especially from FIG. 5 wherein, for a clearer illustration, the lid 2′ and the turntable top section 2″ are not shown.

In order to fix the quill shaft 7 in the outer part 3 in the axial direction, an annular groove 59 is provided in the shaft 7 and an annular groove 58 is arranged in the bore for the shaft 7 in the outer part 3, these grooves opposing each other. Furthermore, in the outer part 3, two mutually parallel bores 61, passing through the part 3, are provided, lying on both sides of the shaft 7, being tangent against shaft 7 with their central axes, and passing through the annular grooves 58 and 59. Spring steel pins 62 are introduced into the bore 61 and extend through the annular grooves 58, 59, thus preventing the hollow shaft 7 from axial displacement with respect to the outer part 3. The external ends of the bores 61 can be welded shut, for example, in order to prevent falling out of the spring steel pins 62. On account of the arrangement of this mounting means in accordance with this invention, it is possible by application of a force, greater than that occurring during operation of the support, to pull the support 1 off the shaft 7 in the axial direction, the spring steel pins 62 being forced out of the annular groove 59 of the shaft 7 during this step.

The lower end of the outer part 3 of support 1 projects into a bearing unit 70 wherein the shaft 7 is supported by two bearings 77, 78. The lower end of support 1 extends into the upper end of the bearing unit 70. A hose brake 71 is arranged between the lower end of the support 1 and the upper end of the bearing unit 70 and encompasses the lower end of support 1. The upper end of the bearing unit 70 is closed off by a circular-ring-shaped lid 79 preventing the slipping out of the hose brake 71.

The compressed gas is fed into the hollow shaft 7 in the bearing unit 70 between the two bearings 77 and 78. For this purpose, an annular space 76 is provided, defined by two labyrinth seals 72, 73, a sleeve 74 in contact with the inside of the housing wall 75 of bearing unit 70, and the shaft 7. The annular space 76 is connected with the bore in the shaft 7 via bores 80. The feeding of the compressed gas into the annular space 76 is affected through a bore in the housing wall 75 and a recess in the sleeve 74 by way of a connecting piece 81 threaded into the housing wall 75.

The quill shaft 7 is connected at its lower end 82 by way of a clutch 83 to the motor 23 attached to the bearing unit 70.

The movement of the cams 9' takes place as follows: During operation, the cams 9' are, for example, in the radially innermost position illustrated in FIG. 5. The support 1 is then braked from its rotary motion to standstill. The hose brake 71 is pressurized and retains the support 1 in its relative position with respect to the bearing unit 70. The motor 23 then briefly turns in the direction of revolution opposed to the operating direction of rotation. This movement is transmitted by way of the shaft 7 and the rod 56 to the toothed rim 53. The rod 56 moves in the recesses 75 having a circular ring segment shape in the outer part 3. On account of the rotational movement of the toothed rim 53 relatively to the outer part 3 and, respectively, the lid 2' and the turntable top section 2", the cams 9' are rotated, via the pinions 52 of shafts 50, from their operating position into a position located radially farther outwardly. At this point, simple exchanging of the disk-shaped article 11 is possible. Subsequently, the motor 23 begins to turn again in its operating direction of rotation. The hose brake 71 is still maintained under pressure for a brief period of time during this step. On account of the thus-produced relative movement of the gear rim 53 with respect to the support 1, the cams 9 are again rotated into their radially inward position. The hose brake 71 is again released, and processing of the presently clamped-in-place, disk-shaped article 11 can be performed.

The opening and closing motion of the cams 9 can be additionally enhanced by two leaf springs 63 acting between the outer part 3 and the toothed rim 53. The two leaf springs 63 are forced with one of their ends 64 into a slit in the outer part 3. With their other ends 65, the leaf springs engage a recess 66 in the toothed rim 53. The two leaf springs 63 are preferably under pretensioning in this arrangement. In order to permit movement of the springs 63, recesses 67 are provided in the outer part 3 lying in opposition to the recesses 66 in the toothed rim 53.

I claim:

1. Device for treating slice-shaped articles with a liquid, comprising a tank and a support disposed within said tank, said support comprising a pair of coaxial members mounted for rotation within said tank, said pair of coaxial members defining a circular surface for supporting a slice-shaped article and an annular space between the coaxial members terminating in an annular nozzle directed toward said circular surface, said nozzle being adapted to receive compressed gas for the formation of a gas cushion between said support and a slice-shaped article, said nozzle having an outlet orifice forming an acute angle with said circular surface, said support further comprising stops arranged on said circular surface and adapted to face a said slice-shaped article and provide lateral support therefor; said tank comprising at least two annular ducts opening interiorly of said tank, and means for changing the relative position of said support within said tank.

2. Device according to claim 1, further comprising a shaft carrying said support, and means for raising and lowering said shaft relative to said tank.

3. Device according to claim 2 wherein said tank has a central axis congruent with the axis of said shaft, and further comprising a motor in driving connection with said shaft for rotating said shaft about its axis.

4. Device according to claim 2, wherein said shaft is hollow and adapted to be connected to a source of compressed gas, thereby to supply compressed gas to said nozzle for formation of a said gas cushion.

5. Device according to claim 1, wherein said annular ducts each comprise a bottom portion and at least one slot-shaped aperture placing said duct in communication with the interior of said tank, said slot-shaped apertures being disposed at a level higher than the bottom portions of their respective ducts.

6. Device according to claim 1, wherein said tank further comprises an annular space disposed radially outwardly of said at least two annular ducts, and exhausting means acting on said annular space; each of said at least two annular ducts comprising at least one aperture communicating said annular duct with said annular space.

7. Device according to claim 1, further comprising a conduit connected to each of said at least two annular ducts, for receiving liquid collected from said annular ducts for recycle or discharge.

8. Device according to claim 1, further comprising at least one conduit terminating above said circular surface of said support, said at least one conduit being adapted to supply treatment fluid to said support.

9. Device according to claim 8, wherein said at least one conduit comprises a conduit for feeding rinse water and at least one further conduit for supplying acid.

* * * * *